United States Patent
Mann et al.

(10) Patent No.: US 12,553,673 B2
(45) Date of Patent: Feb. 17, 2026

(54) HEAT EXCHANGE SYSTEM FOR EXCHANGING HEAT WITH A FORMABLE MATERIAL

(71) Applicant: CANON KABUSHIKI KAISHA, Tokyo (JP)

(72) Inventors: Tyler Pearce Mann, Houston, TX (US); Steven C. Shackleton, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 125 days.

(21) Appl. No.: 18/174,415

(22) Filed: Feb. 24, 2023

(65) Prior Publication Data

US 2024/0286316 A1  Aug. 29, 2024

(51) Int. Cl.
*F28F 3/04* (2006.01)
*B29C 35/02* (2006.01)
*B29C 59/02* (2006.01)
*F28F 3/02* (2006.01)

(52) U.S. Cl.
CPC .............. *F28F 3/048* (2013.01); *B29C 35/02* (2013.01); *B29C 59/022* (2013.01); *B29C 59/026* (2013.01); *F28F 3/02* (2013.01)

(58) Field of Classification Search
CPC ............... F28F 2215/04; F28F 2245/02; F28F 2245/04; F28F 13/18; F28F 2260/02; F28F 3/048; F28F 2210/10; F28F 9/0263; F28F 9/026; F28F 9/0265; F28F 3/02; H01L 23/473; H01L 23/4735; B29C 59/026; B29C 35/02
USPC ................. 165/80.3, 80.4, 146, 147; 361/699
See application file for complete search history.

(56) References Cited

U.S. PATENT DOCUMENTS

| | | | | |
|---|---|---|---|---|
| 4,730,665 | A | * | 3/1988 | Cutchaw ............... H01L 23/473 257/E23.09 |
| 4,871,015 | A | * | 10/1989 | Foley .................. H01L 23/4006 174/16.3 |
| 4,884,630 | A | * | 12/1989 | Nelson .................. H01L 23/473 257/E23.098 |
| 5,099,311 | A | * | 3/1992 | Bonde ....................... F28F 3/12 257/713 |
| 5,899,077 | A | | 5/1999 | Wright et al. |
| 6,530,425 | B2 | | 3/2003 | Wehrmann et al. |
| 6,771,500 | B1 | * | 8/2004 | Siegel ................. H01L 23/3675 257/E23.098 |

(Continued)

FOREIGN PATENT DOCUMENTS

| | | | | | |
|---|---|---|---|---|---|
| CN | 105870081 | A | * | 8/2016 | ........... H01L 23/473 |
| DE | 3329325 | A1 | * | 3/1984 | .............. F28F 13/08 |
| SU | 683041 | A1 | * | 8/1979 | ............... H05K 7/20 |

*Primary Examiner* — Jianying C Atkisson
*Assistant Examiner* — For K Ling
(74) *Attorney, Agent, or Firm* — Canon U.S.A., Inc. IP Division

(57) ABSTRACT

A heat exchange system includes a housing, a cover, and a sealing mechanism. The housing includes an outer side, an inner side opposite the outer side, a supply channel on the inner side, an exit channel on the inner side, and a plurality of fins on the inner side. The plurality of fins define a plurality of transverse channels. Each transverse provides fluid communication between the supply channel and the exit channel. The cover covers the inner side of the housing. The sealing mechanism compresses the cover and the housing such that a seal is formed between the cover and the housing.

23 Claims, 9 Drawing Sheets

(56) References Cited

U.S. PATENT DOCUMENTS

| | | | |
|---|---|---|---|
| 6,936,194 B2 | 8/2005 | Watts | |
| 7,157,036 B2 | 1/2007 | Choi et al. | |
| 8,066,930 B2 | 11/2011 | Sreenivasan et al. | |
| 8,076,386 B2 | 12/2011 | Xu et al. | |
| 8,187,559 B2 | 5/2012 | Gruss et al. | |
| 8,349,241 B2 | 1/2013 | Sreenivasan et al. | |
| 9,564,385 B2* | 2/2017 | Schmit | H01L 23/043 |
| 10,022,482 B2 | 7/2018 | Fini et al. | |
| 10,561,040 B1* | 2/2020 | Lunsman | H05K 7/20272 |
| 2004/0068991 A1* | 4/2004 | Banney | F28F 1/045 |
| | | | 62/3.3 |
| 2006/0071326 A1* | 4/2006 | Chrysler | H01L 23/473 |
| | | | 257/E23.098 |
| 2006/0096299 A1* | 5/2006 | Mamitsu | H05K 7/20927 |
| | | | 257/E23.098 |
| 2008/0237847 A1* | 10/2008 | Nakanishi | F28F 3/12 |
| | | | 257/722 |
| 2009/0129011 A1* | 5/2009 | Balzano | H01L 23/473 |
| | | | 361/689 |
| 2009/0236083 A1* | 9/2009 | Brand | F28F 3/048 |
| | | | 165/181 |
| 2013/0087307 A1* | 4/2013 | Brandenburg | H05K 7/20872 |
| | | | 165/51 |
| 2015/0351283 A1* | 12/2015 | Yamada | H01L 23/473 |
| | | | 165/80.4 |
| 2017/0186667 A1* | 6/2017 | Choudhury | G06F 1/20 |
| 2019/0221499 A1* | 7/2019 | Chang | F28D 9/0093 |
| 2019/0269033 A1* | 8/2019 | Dede | H05K 7/20281 |
| 2019/0368413 A1* | 12/2019 | Carter | H05K 7/20927 |
| 2020/0025466 A1* | 1/2020 | Nakano | H01L 21/4882 |
| 2020/0266126 A1* | 8/2020 | Arai | H05K 1/181 |
| 2021/0199384 A1* | 7/2021 | Minamitani | F28D 9/0062 |
| 2021/0239310 A1* | 8/2021 | Zhou | H01L 23/467 |
| 2022/0373275 A1* | 11/2022 | Mostafavi Yazdi | F28F 3/12 |
| 2023/0273657 A1* | 8/2023 | Chen | G06F 1/20 |
| | | | 165/80.4 |

* cited by examiner

HEAT EXCHANGE SYSTEM FOR EXCHANGING HEAT WITH A FORMABLE MATERIAL

BACKGROUND

Field of Art

The present disclosure relates to system for exchanging heat with a formable material in a nanofabrication system.

Description of the Related Art

Nanofabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

Nanofabrication techniques include nanoimprinting and planarizing. Nanoimprint and planarization are useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, STT-RAM, MEMS, optical components, and the like. Exemplary nanofabrication systems using nanoimprinting and planarizing processes are described in detail in numerous publications, such as U.S. Pat. Nos. 8,349,241, 8,066,930, and 6,936,194.

The technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The patterning process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

A planarization technique sometimes referred to as inkjet-based adaptive planarization (IAP) involves dispensing a variable drop pattern of formable material between the substrate and a superstrate, where the drop pattern varies depending on the substrate topography. A superstrate is then brought into contact with the formable material after which the material is polymerized on the substrate, and the superstrate removed.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

In nanofabrication systems, depending on the product being manufactured, the process requires heating or cooling a formable material before dispensing the formable material to optimize jetting performance. In known dispensing systems, the heat exchange systems are not capable of heating or cooling formable material to a target temperature to allow for the formable to material to be achieve optimal jetting performance. The desired temperature will depend on the material properties of the formable material. For example, some formable materials are too viscous at standard temperate and need to be heated for optimal jetting performance while other formable material may not be viscous enough for optimal jetting performance and need to be cooled. Finally, known heating systems are not easy to clean, such as when switching the formable material being dispensed. Thus, there is a need in the art for a heating system that is able to heat or cool formable material to a target temperature (e.g., as low as 10° C. and up to 40° C.) while being easier to clean.

SUMMARY

A heat exchange system comprises a housing including an outer side, an inner side opposite the outer side, a supply channel on the inner side, an exit channel on the inner side, and a plurality of fins on the inner side, the plurality of fins defining a plurality of transverse channels, each transverse channel of the plurality of transverse channels providing fluid communication between the supply channel and the exit channel, a cover covering the inner side of the housing, and a sealing mechanism configured to compress the cover and the housing such that a seal is formed between the cover and the housing.

A method of cleaning a heat exchange system, the heat exchange system including a housing including an outer side, an inner side opposite the outer side, a supply channel on the inner side, an exit channel on the inner side, and a plurality of fins on the inner side, the plurality of fins defining a plurality of transverse channels, each transverse channel of the plurality of transverse channels providing fluid communication between the supply channel and the exit channel, a cover covering the inner side of the housing, and a sealing mechanism configured to compress the cover and the housing such that a seal is formed between the cover and the housing, the method comprising: releasing the seal formed between the cover and the housing, removing the cover to expose the inner side of the housing, cleaning the supply channel, the exit channel, the plurality of fins, and the plurality of transverse channels, covering the inner side of the housing with the cover, and reforming the seal between the cover and the housing.

A method of making an article comprises changing a temperature of a formable material by flowing the formable material into and then out of a heat exchange system, the heat exchange system including a housing including an outer side, an inner side opposite the outer side, a supply channel on the inner side, an exit channel on the inner side, and a plurality of fins on the inner side, the plurality of fins defining a plurality of transverse channels, each transverse channel of the plurality of transverse channels providing fluid communication between the supply channel and the exit channel, a cover covering the inner side of the housing, and a sealing mechanism configured to compress the cover and the housing such that a seal is formed between the cover and the housing, dispensing the formable material onto a substrate using a dispenser, forming a pattern or a layer of the dispensed formable material on the substrate, and processing the formed pattern or layer to make the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure, and are therefore not to be considered limiting of its scope, for the disclosure may admit to other equally effective embodiments.

Figure 1:
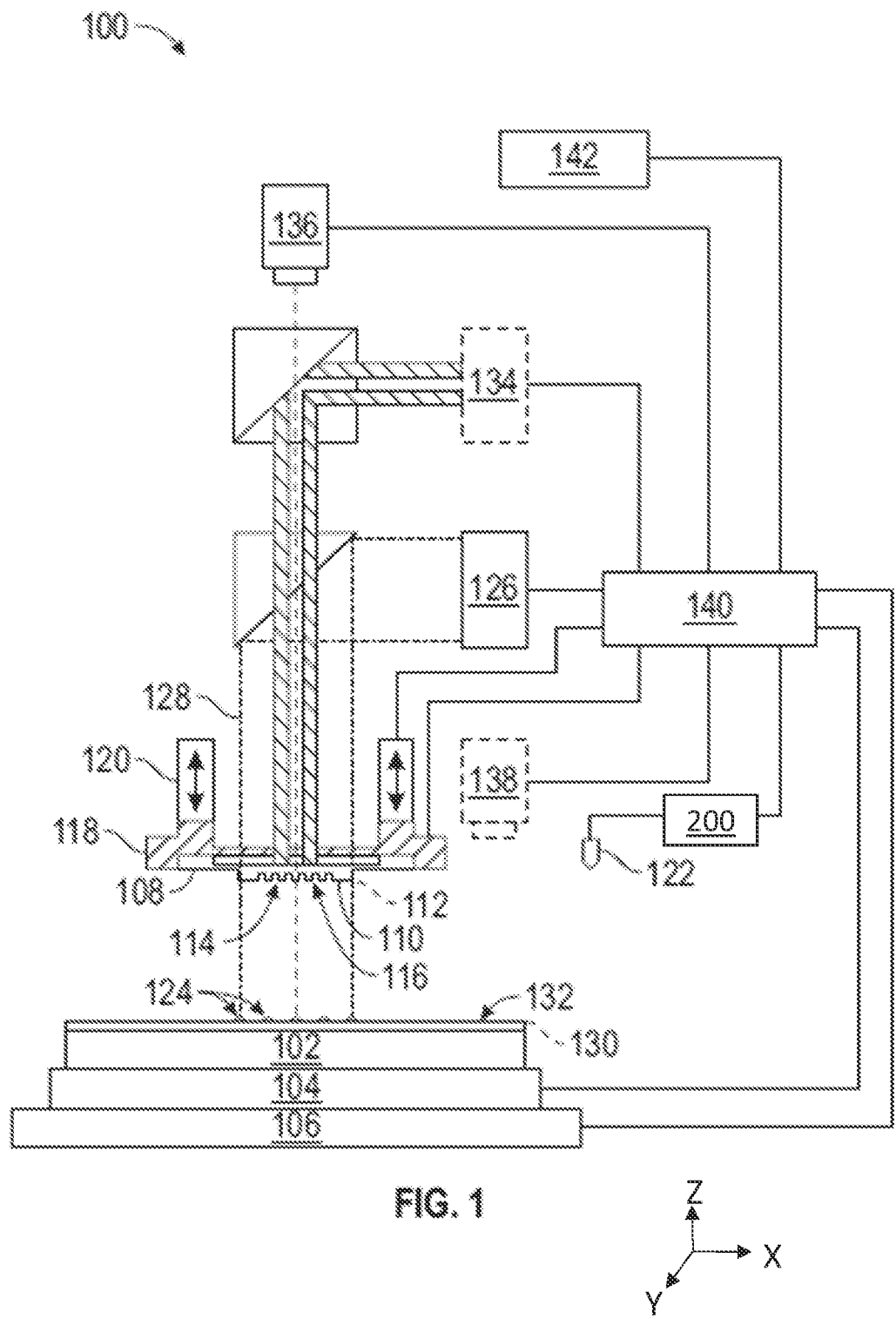
FIG. 1 is an illustration of an example nanofabrication system in accordance with an example embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Throughout this disclosure, reference is made primarily to nanoimprint lithography, which uses the above-mentioned patterned template to Impart a pattern onto formable liquid. However, as mentioned below, in an alternative embodiment, the template is featureless in which case a planar surface may be formed on the substrate. In such embodiments where a planar surface is formed, the formation process is referred to as planarization. Thus, throughout this disclosure, whenever nanoimprint lithography is mentioned, it should be understood that the same method is applicable to planarization. The term superstrate is used in place of the term template in instances where the template is featureless.

As noted above, known heat exchange systems for changing the temperature of a formable material is not able have the formable material reach relatively low temperatures (e.g., as low as 10° C.) or reach relatively high temperatures (e.g., up to 40° C.), and is not easy to clean. Thus, it desirable for a heat exchange system that is able to cool or heat formable material to a target temperature (e.g., as low as 10° C. and as high as 40° C.) that is easy to clean.

Nanofabrication System (Shaping System)

FIG. 1 is an illustration of a nanoimprint lithography system 100 in which an embodiment may be implemented. The nanoimprint lithography system 100 is used to shape a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate. In such embodiments where a planar surface is formed, the formation process may be alternatively referred to as planarization and the featureless template may be alternatively referred to as a superstrate.

The template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head may include one or more actuators such as voice coil motors, piezoelectric motors, linear motor, nut and screw motor, etc., which are configured to move the template chuck 118 relative to the substrate in at least the z-axis direction, and potentially other directions (e.g., x, y, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference. Some formable material may have a viscosity that is too low for optimal jetting absent being cooled (e.g., have a viscosity of 1 to 15 cP at 23° C.). Other formable material may have a viscosity that is too high for optimal jetting absent being heated (e.g., have viscosity 15 cP to 35 cP at 23° C.). In the former case, it is desirable to cool the formable material to a target temperature where formable reaches a target viscosity that provides optimal jetting performance. In the latter case, it is desirable to heat the formable material to a target temperature where the formable material reaches a target viscosity that provided optimal jetting performance. In an example embodiment, the target viscosity in both cases is about 15 cP. Optimal jetting performance means that the drop sizes of the formable material when dispense are consistently the same size across the dispensing period.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a heat exchange system 200. The heat exchange system 200 heats or cools the formable material prior to reaching the fluid dispenser 122. As noted above, some formable material may need to be cooled to reach the target viscosity for optimal jetting, while other formable material needs to be heated to reach the target viscosity for optimal jetting. Optimal jetting in the present context means jetting drops with a consistent drop volume with few satellites. A consistent drop volume has a standard deviation of the drop volume that is less than 1% of the drop volume. Having few satellites means less than 1 satellite drop per 1000 standard drops. A satellite drop is an unintended drop that has less 10% of the drop volume of the median drop. In one example embodiment the formable material is heated to about 40° C. using the heat exchange system 200. In another example embodiment, the formable material is cooled to as low as 10° C. using the heat exchange system 200. The heat exchange system 200 is able to heat or cool the formable material to the target temperature. The details of the heat exchange system 200 is provided below.

The nanoimprint lithography system 100 may further comprise a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has made contact with the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108, the separation of the template 108 from cured formable material, and can be used to keep track the progress over the imprinting process.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatial temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has made contact with the formable material 124. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136 and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general purpose computer. The processor 140 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an Internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g., UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124 forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form the planar layer with a featureless patterning surface 112.

The imprinting process may be done repeatedly in a plurality of imprint fields that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features which are used to prevent extrusions. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template/Superstrate

Figure 2:
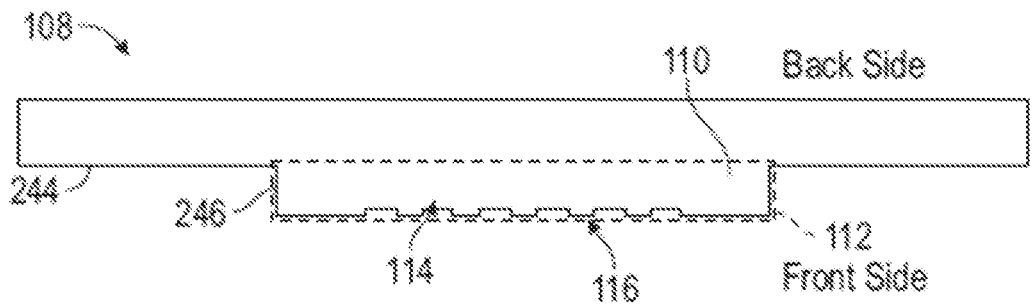
FIG. 2 is an illustration of an example template in accordance with an example embodiment.

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

An alternative plate may be used in another embodiment, referred herein as a superstrate. In the case of the superstrate, the patterning surface 112 is featureless. That is, in an embodiment there is no pattern on the surface 112. A superstrate with no pattern is used in a planarization process. Thus, when a planarization process is performed, the superstrate is used in place of the template shown in FIG. 1.

Imprinting/Planarizing Process

Figure 3:
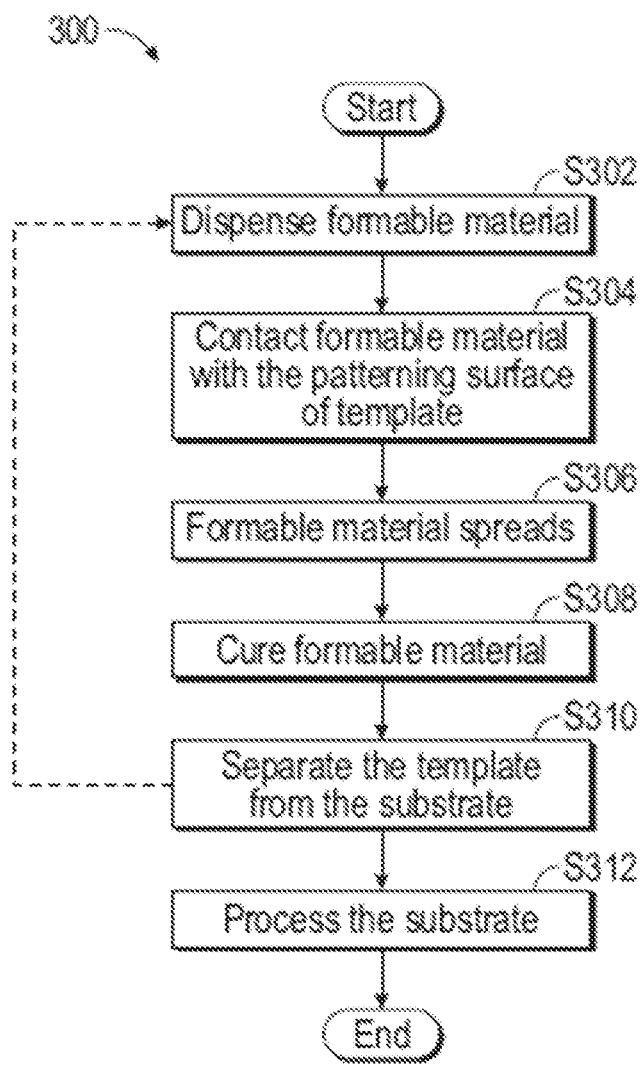
FIG. 3 is a flowchart illustrating an example nanofabrication method in accordance with an example embodiment.

FIG. 3 is a flowchart of an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control imprinting process 300.

In an alternative embodiment, a similar process may be performed to planarize the substrate 102. In the case of planarizing, substantially the same steps discussed herein with respect to FIG. 3 are performed, except that a patternless superstrate is used in place of the template. Thus, it should be understood that the following description is also applicable to a planarizing method. When using as superstrate, the superstrate may be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprint field i (index i may be initially set to 1) of the substrate 102 to a fluid dispense position below the fluid dispenser 122. The substrate 102, may be divided into N imprint fields, wherein each imprint field is identified by an index i. In which N is a real integer such as 1, 10, 75, etc. $\{N \in \mathbb{Z}^+\}$. In a dispensing step S302, the processor 140 may cause the fluid dispenser 122 to dispense formable material onto an imprint field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc.

After, the droplets are dispensed, then a contacting step S304 may be initiated, the processor 140 may cause one or both of the substrate positioning stage 106 and a template positioning stage to bring the patterning surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S310, the processor 140 uses one or more of the substrate chuck 104, the substrate positioning stage 106, template chuck 118, and the imprint head 120 to separate the patterning surface 112 of the template 108 from the cured formable material on the substrate 102.

If there are additional imprint fields to be imprinted then the process moves back to step S302. In an embodiment, additional processing is performed on the substrate 102 in a processing step S312 so as to create an article of manufacture (e.g., semiconductor device or an optical component). In an embodiment, each imprint field includes a plurality of devices.

The further processing in processing step S312 may include etching processes to transfer a relief image into the substrate that corresponds to the pattern in the patterned layer or an inverse of that pattern. The further processing in processing step S312 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

Heat Exchange System

Figure 4:
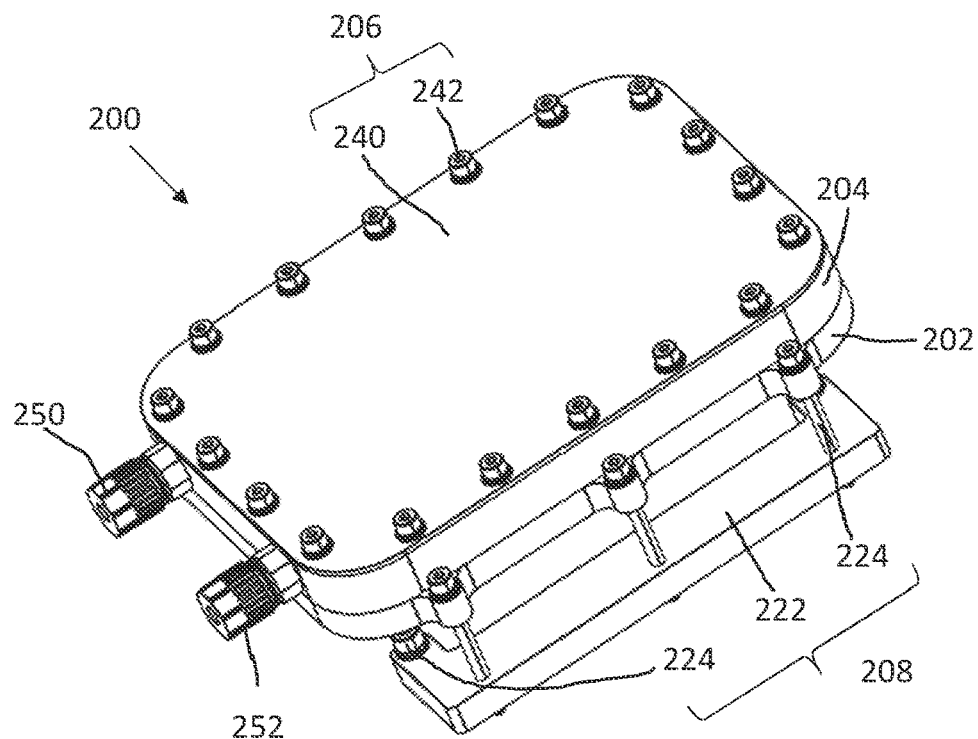
FIG. 4 is a perspective view of an example heat exchange system in accordance with an example embodiment.
Figure 5:
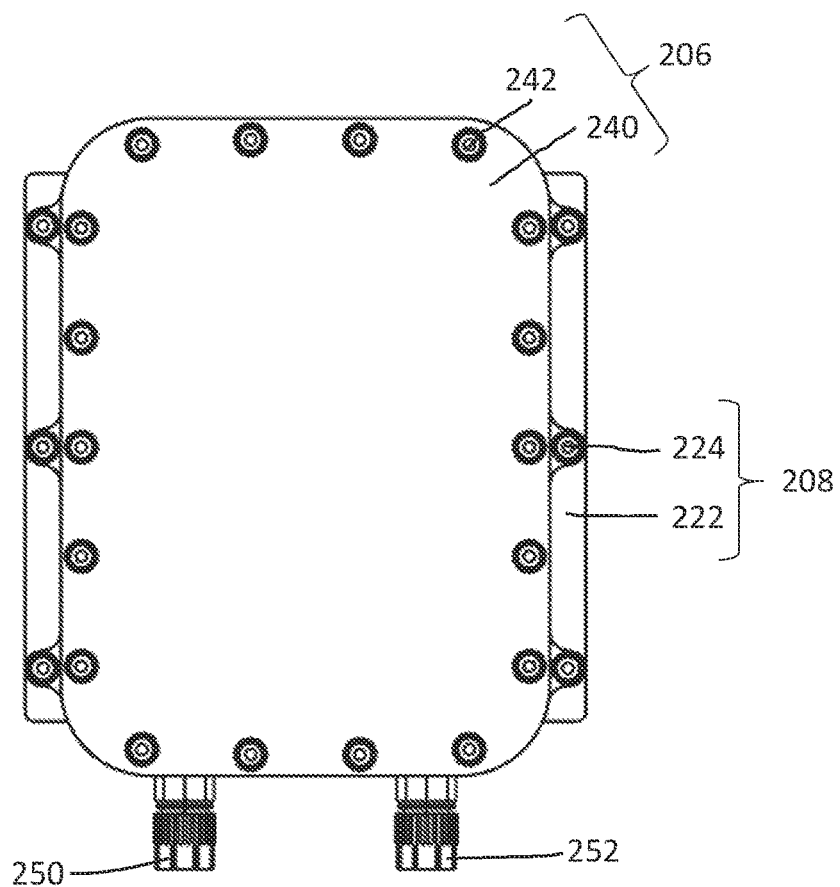
FIG. 5 is a front view of the example heat exchange system of FIG. 4.
Figure 6:
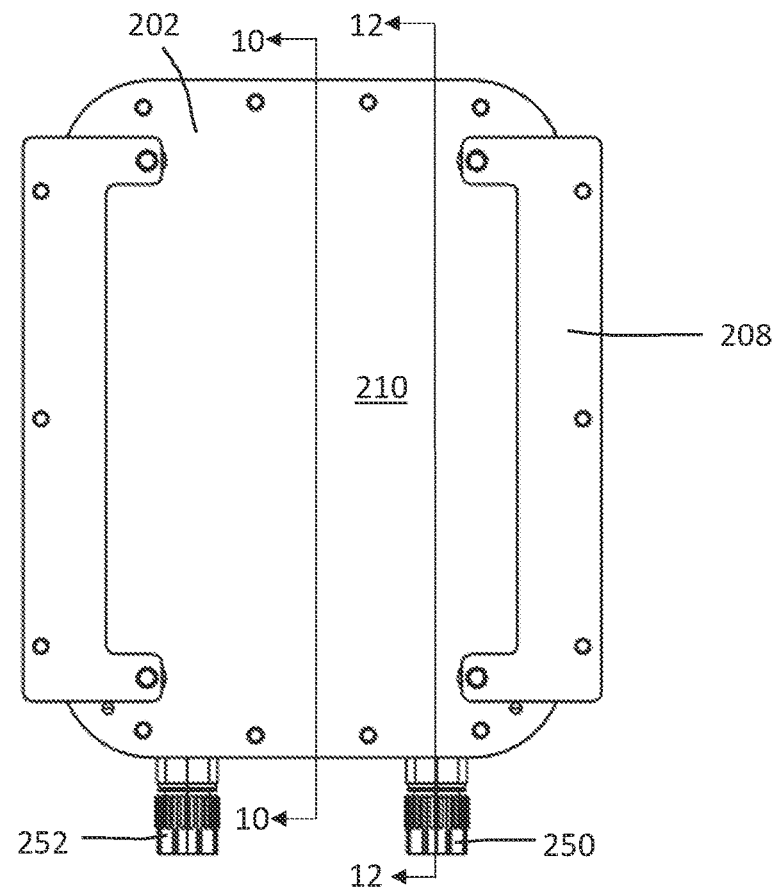
FIG. 6 is a back view of the example heat exchange system of FIG. 4.
Figure 7:
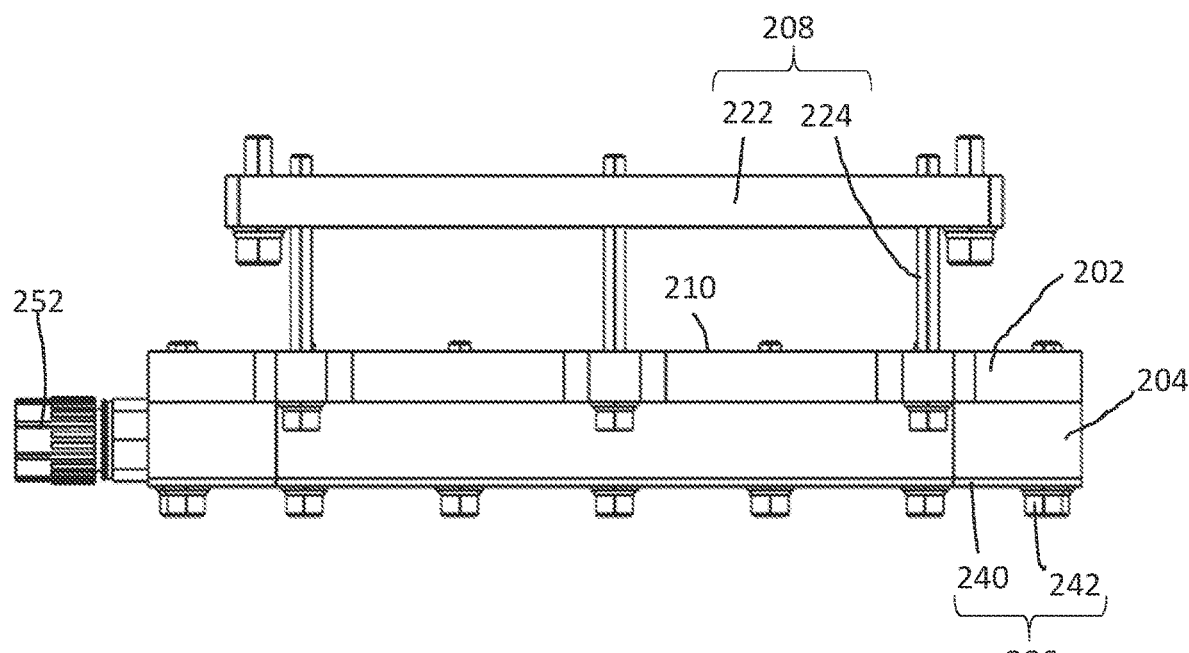
FIG. 7 is a side view of the example heat exchange system of FIG. 4.
Figure 8:
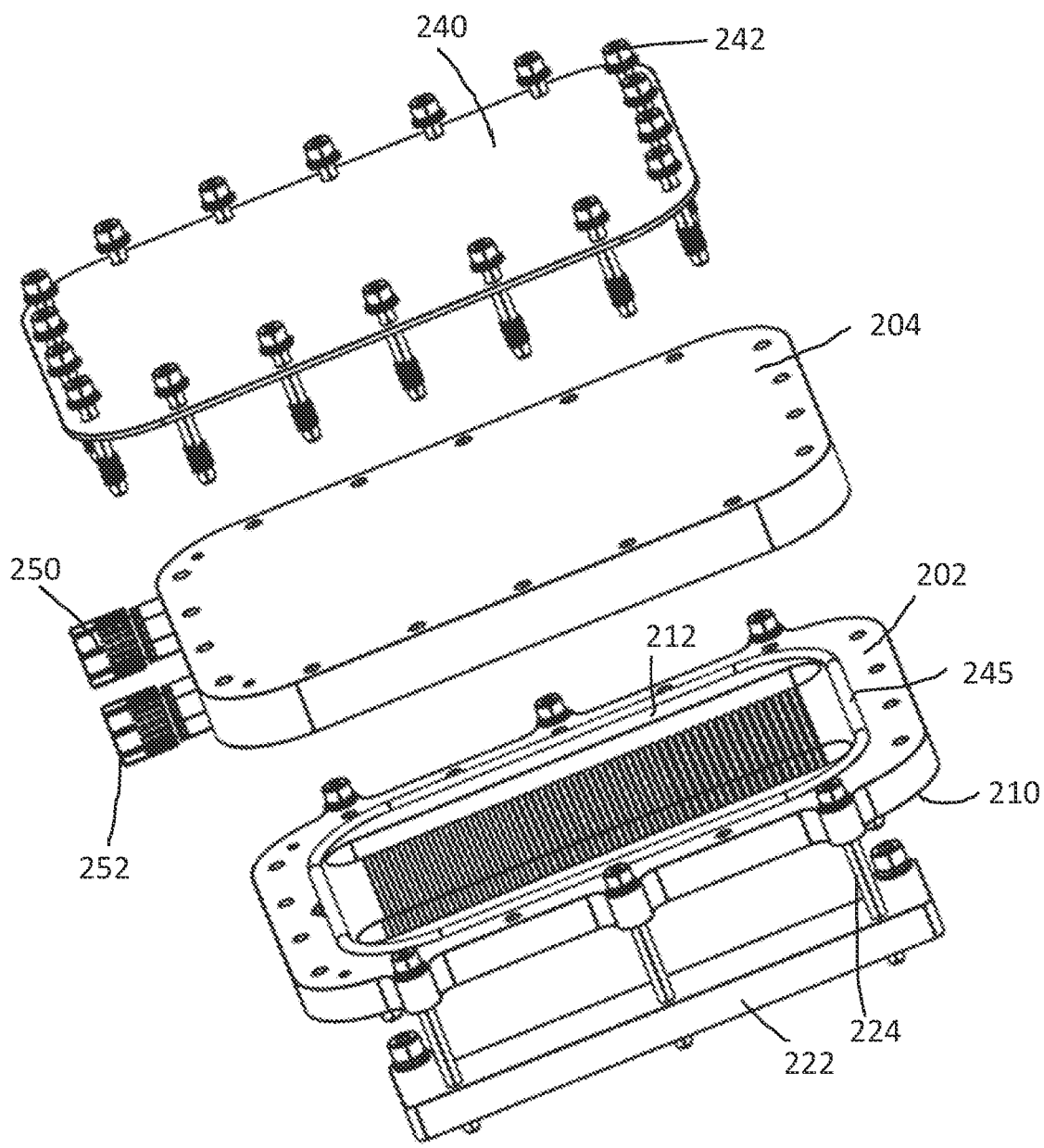
FIG. 8 is an exploded perspective view of the example heat exchange system of FIG. 4.

As noted above, the nanoimprint lithography system 100 includes a heat exchange system 200. The heat exchange system 200 may be located between a material supply system (not shown) that supplies the formable material and the dispenser 122. FIG. 4 shows a perspective view of the heat exchange system 200. FIG. 5 shows a top view of the heat exchange system 200. FIG. 6 shows a bottom view of heat exchange system 200. FIG. 7 shows a side view of the heat exchange system 200. FIG. 8 shows an exploded perspective view of the heat exchange system 200. As seen in FIGS. 4-8, the heat exchange system 200 generally includes a housing 202, a cover 204, a sealing mechanism 206, and a mounting adapter 208. The sealing mechanism 206 is configured to compress the cover 204 and the housing 202 such that a hermitic seal is formed between the cover 204 and the housing 202. The heat exchange system 200 further includes a supply port 250 and an exit port 252. The supply port 250 is coupled with a supply conduit (not shown) that routes the not-yet-heated/cooled formable material from a reservoir of the material supply system into the heat exchange system 200. The exit port 252 is coupled with an exit conduit (not shown) that routes the heated formable material out of the heat exchange system 200 in the direction of the dispenser 122. Thus, the formable material that has not yet been heated/cooled enters the heat exchange system 200 via the supply port 252, is heated/cooled while traveling through the heat exchange system 200, and then the heated/cooled formable material exits the heat exchange system 200 via the exit port 252.

FIG. 5 best shows the orientation of the heat exchange system 200 when used in the nanoimprint lithography system 100. That is, as shown in FIG. 5, in operation, the heat exchange system 200 is oriented such that the supply port 250 and exit port 252 extend toward the ground such that the flow of formable material travels against gravity as it enters the heat exchange system 200 via the supply port 250 and travels with gravity as it exits the heat exchange system 200 via the exit port 252. As also shown in FIG. 5, in operation, the heat exchange system is 200 is further oriented such that the sealing mechanism 206 is facing the operator, with the mounting adapter 208 extending away from the operator.

Figure 9:
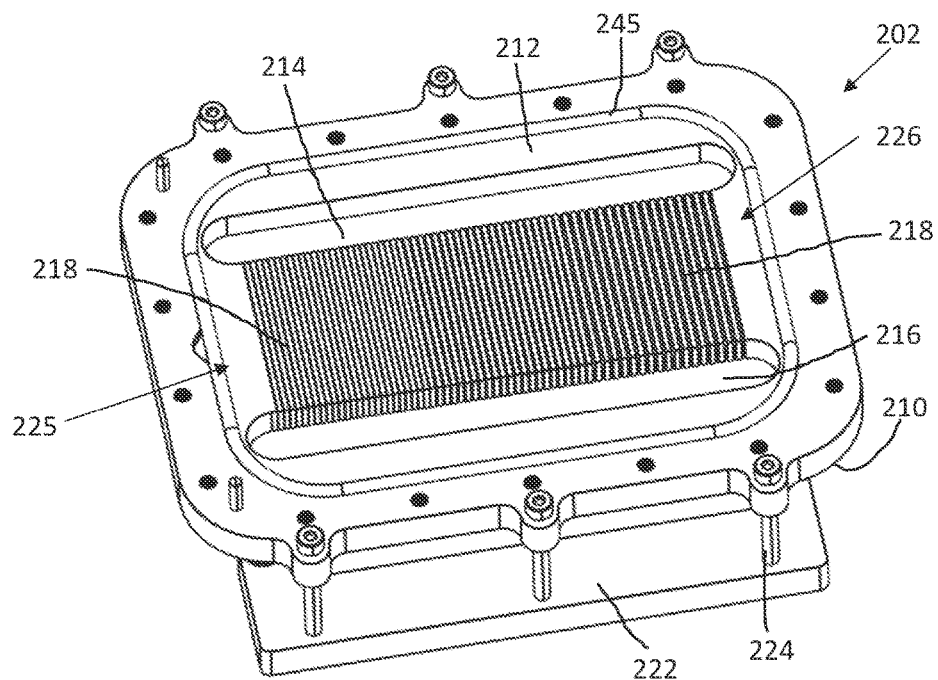
FIG. 9 is a perspective view of a housing and mounting adapter of the example heat exchange system of FIG. 4, with other portions omitted.

The details of the housing 202 are best seen in FIGS. 8 and 9. FIG. 9 shows a perspective top view of the housing 202, with the cover 204 omitted. The housing 202 includes an outer side 210 and inner side 212. The inner side 212 is opposite to the outer side 210. The housing 202 further includes a supply channel 214 and an exit channel 216. Both of the supply channel 214 and the exit channel 216 are on the inner side 212. The housing 202 includes a plurality of fins 218 (also referred herein as fins), which are also on the inner side 212. The plurality of fins 218 define a plurality of transverse channels 220 (also referred herein as transverse channels). More particularly, each transverse channel is defined by two adjacent fins of the plurality of fins 218. As seen in FIGS. 8 and 9, the plurality of fins are formed as an array of parallel adjacent fins. That is, a plane defined by a surface of one of the fins is parallel to a plane defined by a corresponding surface of every other fin. The plurality of fins 218 may be formed seamlessly with the inner side 212 of the housing 202. That is, the plurality of fins 218 are preferably not formed by attaching the plurality fins to the inner side 212 of housing 202, such as via welding process. Rather, the plurality of fins 218 are formed by additive/subtractive manufacturing or by other known techniques such that the plurality of fins 218 are seamlessly integrated with the inner side 212 of the housing 202. In other words, the fins and the housing are formed as monolithic structure. The number of fins of the plurality of fins is not particular limited. The more fins there are, the better the heat transfer will be. Thus, the number of fins are preferably maximized within the housing, where the main limitation on the number of fins is the manufacturing capability. The plurality of fins may include tens to millions of fins. In another embodiment the plurality of fins may include tens to thousands or hundreds of thousands of fins. In an example embodiment, the plurality of fins may include 30 to 100 fins.

As best seen in FIG. 9, each transverse channel of the plurality of transverse channels 220 provides fluid communication between the supply channel 214 and the exit channel 216. As explained below with respect to the cover 204, formable material will enter into the supply channel 214 from an external source (e.g., pumped from a reservoir containing the formable material). The formable material will then flow through the plurality of transverse channels 220, i.e., in between the adjacent fins of the plurality of fins 218. The formable material then exits the plurality of transverse channels 220 and enters into the exit channel 216.

The heat exchange system 200 may be mounted to a heater/cooler 400 (FIG. 14) via the mounting adapter 208. The heater/cooler 400 is capable of heating or cooling, depending on how it is operated, e.g., a thermoelectric or fluid based heat pump. The mounting adapter 208 may include a bracket 222 and fasteners 224 (e.g., bolts, screws, etc.). The shape of the bracket 222 and location of fasteners 224 may be tailored depending on the particular heater/cooler being used. Preferably, the bracket 222 and the fasteners 224 are configured such that when the heat exchange system 200 is coupled with the heater/cooler, the outer side 210 of the housing 202 contacts the heater/cooler. This allows the heat generated by the heater/cooler 400 to be transferred to the housing 202 or allows heat to be withdrawn from the housing 202 to the heater/cooler 400. The heat being transferred to the housing 202 from the heater/cooler 400 includes transferring heat to the plurality of fins 218. Likewise, the heat being transferred from the housing 202 to the heater/cooler 400 includes transferring heat from the plurality of fins 218.

As the formable material passes through the plurality of transverse channels 220, in the case of heating the formable material, heat transfers from the heated housing 202 to the formable material. In the case of cooling the formable material, as the formable material passes through the plurality of transverse channels 220, heat transfers from the formable material to the cooled housing 202. Because some of the fins are closer to the entrance/exit end 225 of the housing 202 than fins on the opposite end 226 of the housing 202, the distance between adjacent fins 218 (i.e., the width of the transverse channels 220) are tailored so that the fluid will flow through all of the channels at the same flow rate despite being different distances from the entrance/exit. In particular, to control the flow rate, the fins 218 at the entrance/exit end 225 of the housing 202 are closer together as compared to the distance between fins 218 at the opposite end 226 of the housing 202. In other words, the width of the transverse channels 220 near the entrance/exit end 225 of the housing 202 are smaller than the width of the transverse channels 220 near the opposite end 226 of the housing 202. More particularly, the distance between adjacent fins 218 gradually increases the farther away they are from the entrance/exit end 225. Thus, the width of the transverse channels 220 gradually increases as the farther away they are from the entrance/exit end 225.

Figure 10:
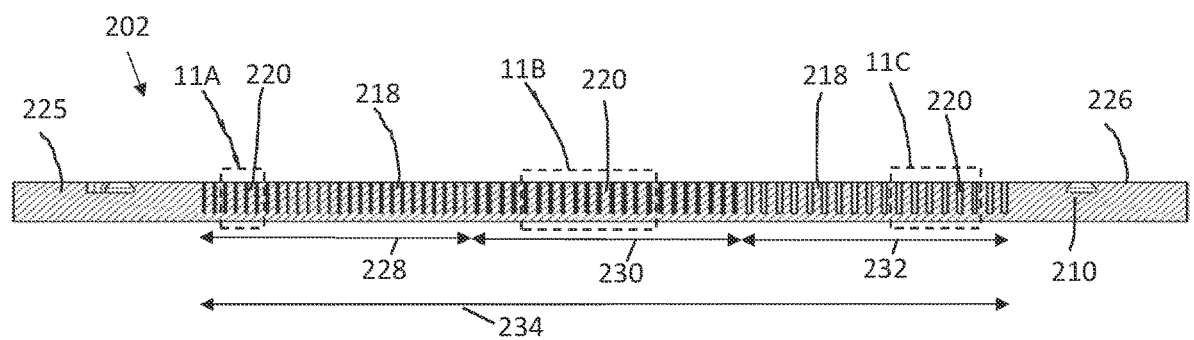
FIG. 10 is a cross-sectional view of the housing of the example heat exchange system, taken along line 10-10 of FIG. 6, with other portions omitted.
Figure 11A:
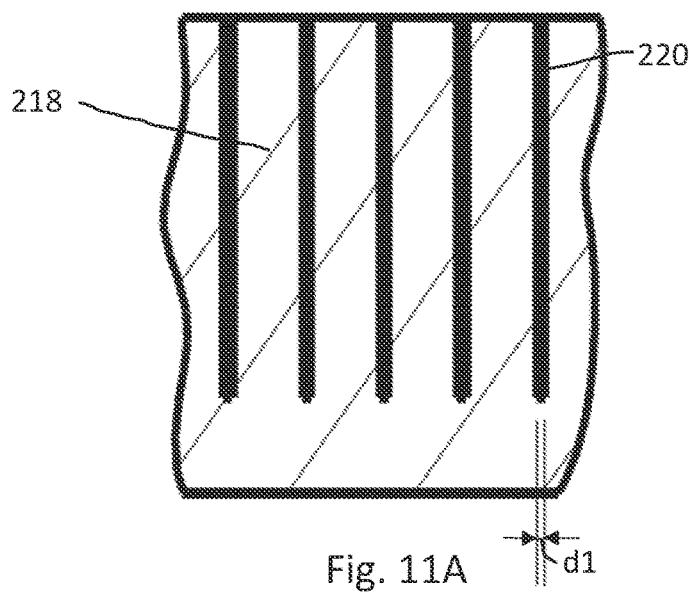
FIG. 11A is a close-up view of portion 11A in FIG. 10.
Figure 11B:
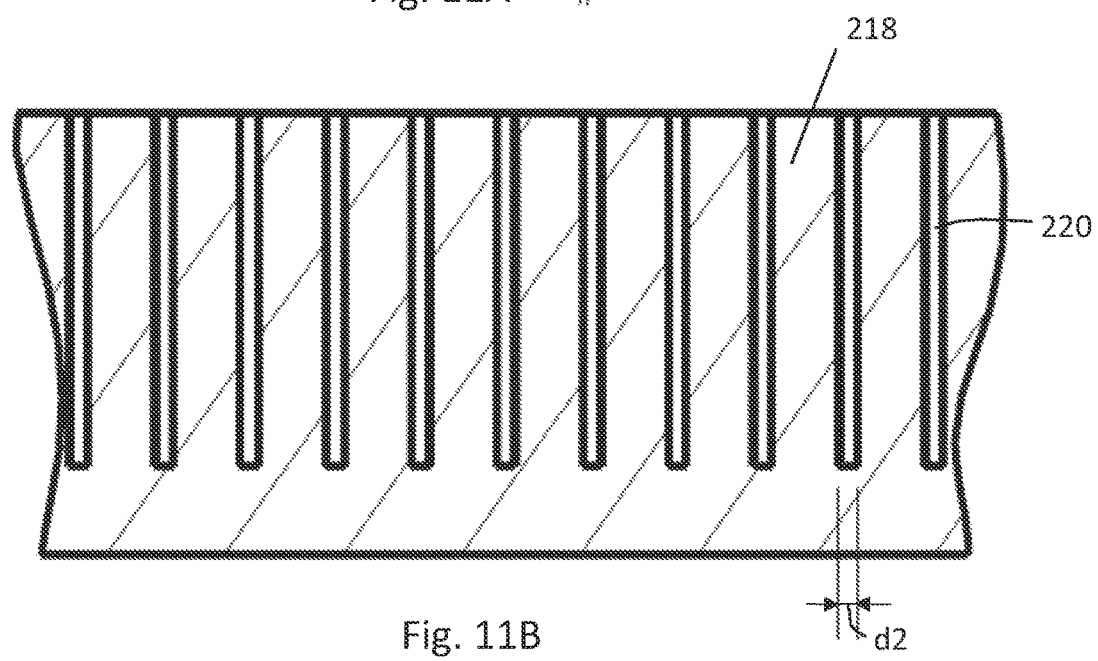
FIG. 11B is a close-up view of portion 11B in FIG. 10.
Figure 11C:
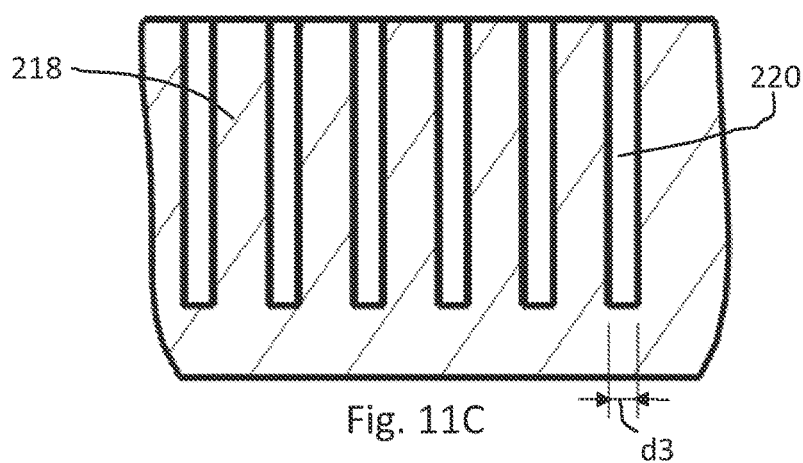
FIG. 11C is a close-up view of portion 11C in FIG. 10.

FIG. 10 shows a cross-sectional view of the housing 202 taken along line 10-10 of FIG. 6. FIG. 11A shows a close up view of the portion 11A in FIG. 10. FIG. 11B shows a close up view of the portion 11B in FIG. 10. FIG. 11C shows a close up view of the portion 11C in FIG. 10. The gradual increase the distance between adjacent fins 218 and the gradual increase in the width of the transverse channels 220 are best seen in FIGS. 10 to 11C. As seen in FIG. 10, the portion 11A is a portion at the entrance/exit end 225 of the housing 202, the portion 11B is a portion in the middle of the two ends, and the portion 11C is a portion at the opposite end 226 of the housing. As seen in FIG. 11A, the fins 218 at the entrance/exit end 225 of the housing have distance d1 between adjacent fins. The distance d1 is also the width of the transverse channels 220 at the entrance/exit end 225. As seen in FIG. 11B, the fins 218 midway between the ends of the housing 202 have distance d2 between adjacent fins. The distance d2 is also the width of the transverse channels 220 midway between the ends. Finally, as seen in FIG. 11C, the fins 218 at the opposite end 226 of the housing 202 have distance d3 between adjacent fins. The distance d3 is also the width of the transverse channels 220 at the opposite end 226. As shown in FIGS. 11A to 11C, in the illustrated example embodiment, d1 is smaller than d2, while d2 is smaller than d3. The ratio of d1 to d2 (d1:d2) may be 0.99:1 to 0.4:1, more preferably 0.75:1 to 0.375:1. The ratio of d2 to d3 (d2:d3) may be 0.99:1 to 0.6:1, more preferably 0.75:1 to 0.5:1. The ratio of d1 to d3 (d1:d3) may be 0.99:1 to 0.2:1, more preferably 0.75:1 to 0.1875:1.

As best shown in FIG. 10, in an example embodiment, the plurality of fins 218 may be divided into three sections: a first section 228, a second section 230, and third section 232. In an embodiment, each of the three sections 228, 230, 232 are equal in length along a longitudinal direction of the housing 202. The sum of all three sections 228, 230, 232 is the entire length 234 of all of the fins 218 across the housing 202. That is, length of each of the three sections 228, 230, 232 may be equal to each other and ⅓ the entire length 234. In another embodiment, the sections may have different lengths. The first section 228 has the distance d1 between adjacent fins, the second section 230 has the distance d2 between adjacent fins, and the third section 232 has the distance d3 between adjacent fins. In the illustrated embodiment, all of the fins 218 across all of three sections 228, 230, 232 have the same thickness. As a result of all of the fins having the same thickness, the distance d1 being smaller than d2, and the distance d2 being smaller than d3, there are more fins in the first section 228 than the section 230 and more fins in the second section 230 than the third section 232. For example, the number of fins in the first section may be 10% to 25% greater than the number of fins in the second section and the number of fins in the first section may be 30% to 50% greater than the number of fins in the second section. The number of fins in the second section may be 10% to 25% greater than the number of fins in the third section. The number of fins in the first section may contain 38% to 42% of the total number of fins, the second section may contain 30% to 35% of the total number of fins, and the third section may contain 25% to 30% of the total number of fins, where the number of fins selected in each section together totals 100%.

While the illustrated embodiment includes the three distinct sections of spaced fins as discussed above, other configurations of fins are also suitable. For example, other embodiments may have more than three sections, such as five or more or ten or more sections. In another embodiment there may be only two sections. When there are only two sections, the two sections may be equal in length or have different lengths. For example, in a modification of the illustrated embodiment, the first section 228 and the second section 230 may be a single section where d1 and d2 are equal (i.e., a ratio of d1 to d2 is 1:1 in the modified embodiment), thus together being the "first section." In this modified embodiment the third section 232 would be the "second section", where d1=d2 and d1, d2<d3. In another embodiment there may be no defined sections. Rather, the distance between adjacent fins may be increased with every adjacent fin. The illustrated embodiment has the benefit of being simpler to manufacture, while the embodiment in which the distance is changed between every set of two fins would be much more complex to manufacture. Further, in the illustrated embodiment the thicknesses of each fin is identical. However, varying the thickness of the fins is another way to vary the distance between adjacent fins. In any of these various embodiments the common feature is that the fins near the entrance/exit end 225 are closer together than the fins that are farther from the entrance/exit 225 end.

The housing 202, including the fins 218, may be made of a material that has a high thermal conductivity. For example, the housing 202 may be made of silver, copper, gold, aluminum nitride, silicon carbide, aluminum, or combinations thereof. In an example embodiment, the housing 202 is made of aluminum. All of the portions of the housing 202 that come into contact with the formable material (e.g., all surfaces of the fins 218/transverse channels 220 and surfaces of the supply channel 214 and exit channel 216) may be coated with a material that has good chemical compatibility with the formable material (i.e., does not react with the formable material) and provides a resilient barrier to ion contamination (i.e., does not degrade during use). In an example embodiment, the coating material is one or more of: a parylene; an acrylic; a silicone; a urethane; and any other coating material that meets the performance requirements. The coating prevents the heat exchange system 200 from adding metal ion contamination into the flow of formable material. Preferably, the coating is a parylene. The parylene may be parylene N or parylene HT, for example.

Figure 12:
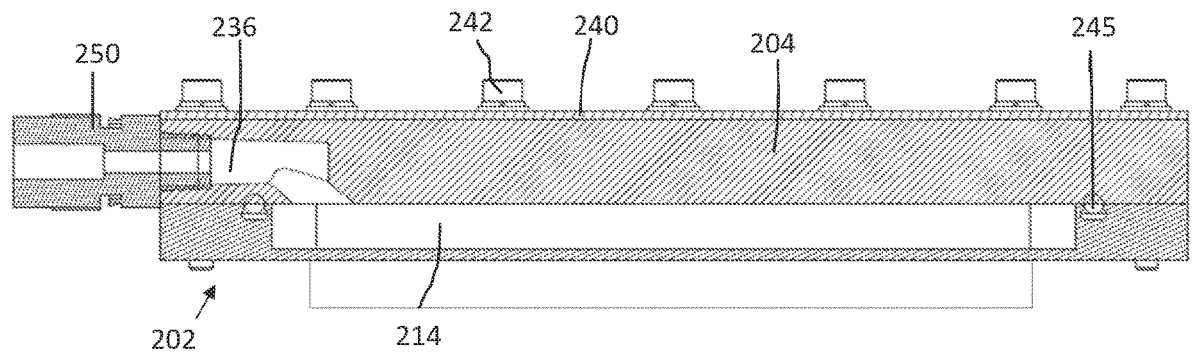
FIG. 12 is a cross-sectional view of the example heat exchange system, taken along line 12-12 of FIG. 6.
Figure 13:
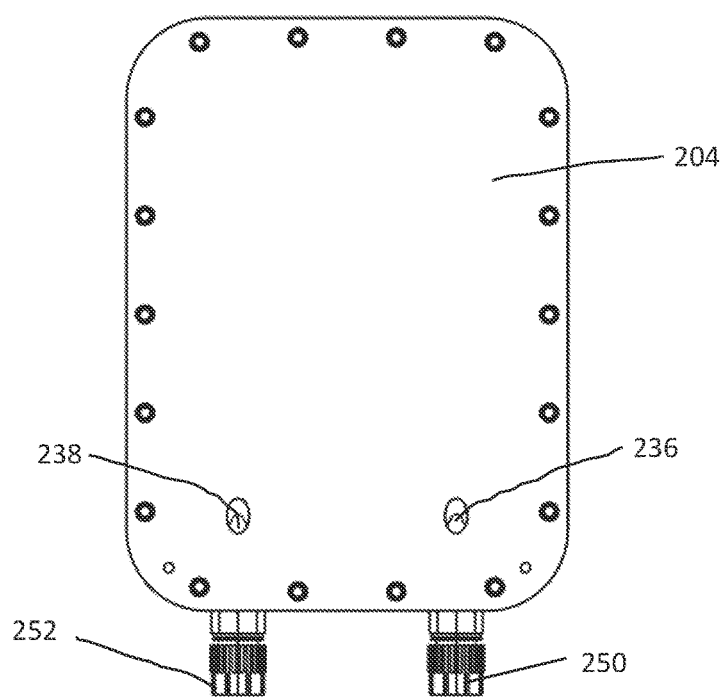
FIG. 13 is a rear view of a cover of the example heat exchange system of FIG. 4.

Prior to entering the housing 202 and after exiting the housing 202, the formable material travels through the cover 204. As seen in FIGS. 4, 7, and 8 the supply port 250 and the exit port 252 are both in communication with the cover 204. As noted above, the formable material, prior to being heated/cooled, enters into the heat exchange system 200 via the supply port 250. FIG. 12 shows a cross-sectional view of the heat exchange system 202 taken along line 12-12 of FIG. 6. As shown in FIG. 12, the cover 204 includes a supply path 236 that has a first end in communication with the supply port 250 and a second end in communication with the supply channel 214 of the housing 202. That is, one end of the supply path 236 opens into the supply port 250 to receive the formable material and the other end of the supply path 236 opens into the supply channel 214. FIG. 13 shows a bottom view of the cover 204. FIG. 13 show the end of the supply path 236 that opens into the supply channel 214 of the housing 202.

The cover 204 may be made of a material that that is chemically inert and has high chemical compatibility with the formable material (i.e., does not react with the formable material). For example, the cover may be made of perfluoroalkoxy alkanes (PFA), polytetrafluoroethylene (PTFE), polychlorotrifluoroethylene (PCTFE), polyvinylidene fluoride (PVDF), high-density polyethylene (HDPE), polyether ether ketone (PEEK), or combinations thereof. In an example embodiment, the cover 204 is made of PTFE.

The formable material will then travel along the supply channel 214 and into the transverse channels 220. Because the distance d1 is smaller than the distance d2, and because the distance d2 is smaller than the distance d3, the formable material will flow more easily through third section 232 than second section 230 and flow more easily through the second section 230 than first section 228. Thus, as the formable material is pumped into supply channel 214 the formable material will travel against gravity and pass through the transverse channels 220 of all three of the sections 228, 230, 232 at the same flow rate. The formable material will then exit the transverse channels 220 and enter into the exit channel 216. The formable material will then flow with gravity down the exit channel 216 until entering an exit path 238 of the cover 204. The formable material will then flow out the exit port 252 and eventually reach the dispenser 122 for dispensing. The housing 202 including all of the fins 218 are heated/cooled by the heater/cooler. The heater/cooler may heat or cool the housing and fins to a temperature from 0° C. to 100° C. Because the formable material flows through the many transverse channels 220, in the case of heating, heat is transferred from the heated housing/fins to the formable material through conduction and convection. In the case of cooling, heat is transferred from the formable material to the housing/fins. Because the fins are spaced apart in the manner described above, the flow rate is also uniform so that the maximum surface area is in contact with the fluid and so that the overall flow of formable material leaving the housing has reached a target temperature. In the case of heating the formable material, the target temperature may be up to 40° C., while in the case of cooling the formable material the target temperature may be as low as 10° C. By reaching the target temperature, the target viscosity has also been reached that provided optimal jetting performance.

As noted above the heat exchange system 200 includes a sealing mechanism 206. The sealing mechanism 206 compresses the cover 204 against the housing 202 to form a hermetic seal between the cover 204 and the housing 202. As best seen in FIG. 8, sealing mechanism 206 includes a plate 240, a plurality of fasteners 242, and a gasket 245. The plate 240 has the same size and shape as the cover 204 and contacts the surface of the cover 204 opposite the side facing the housing 202. The plate 240, however, is many times thinner than the cover 204, such as 5 to 20 times thinner, preferably about 10 times thinner. In the assembled state (FIG. 4) the entirety of the surface of the cover 204 is covered by the plate 240. The plurality of fasteners 242 are disposed along the perimeter of the plate 230 and pass through the perimeter of the cover 204 and the housing 202. The plurality of fasteners 242 may include from 15 to 20 fasteners, for example. The fasteners may be bolts, screws, or the like. The sealing mechanism 206 may include washers between the head of the fastener and the plate 240. The gasket 245 is located in a groove formed in the inner side 212 of the housing 202. In the assembled state, the plurality of fasteners 242 are tightened to compress the plate 240 against the cover 204, which in turn distributes a compression force of the cover 204 against the housing 202. More particularly, in this state, the side of the cover 204 facing the housing 204 comes into contact with the gasket 245 (FIG. 12). Thus, with the plurality of fasteners 242 fully tightened, the compression of the plate 240 against the cover 204, and the compression of the cover 204 against the gasket 245/housing 202, the compression force is distributed providing a hermetic seal between the cover 204 and the housing 202. At full compression, the gasket 245 may be compressed by about 30% as compared to the natural state of the gasket 245 without any compression.

The compression plate may be made of a material that is corrosion resistant and has sufficient hardness to distribute the force imparted by the fasteners to provide the seal. For example, the compression plate may be made of stainless steel.

At certain times, it desirable to be able to access the inside of the housing 202 to clean the heat exchange system 200. This is mainly the case when switching from one formable material to another formable material being dispensed, i.e., as part of a different fabrication. When switching formable material, it is necessary for the previous formable material to be completely removed. Additionally, if the same formable material is being dispensed for a long period of time, for example a year or more, there will eventually be enough contamination from various sources that the heat exchange system 200 should be cleaned. Any contamination of the formable material can negatively impact the final product. Additionally, over the one year or more period of time, it is possible there may be buildup of small amounts of formable material that has polymerized unintentionally. Thus, it is also desirable to clean the heat exchange system 200 to remove such material. In the heat exchange system 200, there is easy access to the housing 202 for cleaning. In operation, the surface of the plate 240 opposite the side contacting the cover 204 faces the operator. The operator may access the inside of the housing 202 by removing the plurality of fasteners 242 and then removing the plate 240 and the cover 204 from the housing. Once opened, because all of the fluid channels and fins are on the inner side 212 of the housing 202, the operator can clean all of the portions of the housing 202 that come into contact with the formable material. The cleaning may include first soaking the housing in nitric acid, followed by rinsing the housing with deionized water, and finally drying the housing with alcohol and/or clean dry air. After cleaning, the operator may simply remount the cover 202 and the plate 240 and then retighten the plurality of fasteners 242, thus once again providing the hermetic seal. Then, the heat exchange system 200 is ready to resume heating/cooling the formable material. The cleaning process may be performed whenever the formable material being dispensed is switched to a different formable material (e.g., for a different fabrication) or if the formable material is not switched out then every 1 to 2 years. The ease of access for cleaning is a significant improvement over existing heat exchange systems.

Figure 14:
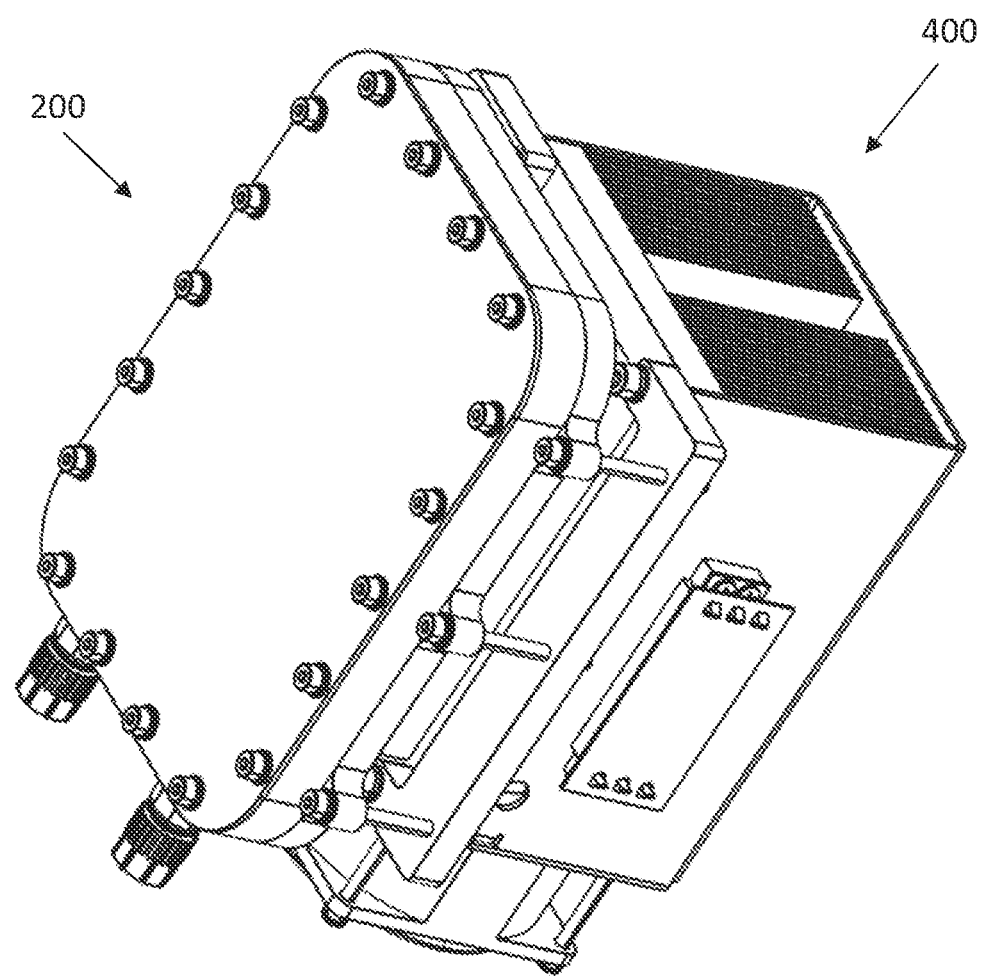
FIG. 14 is perspective view of the example heat exchange system of FIG. 4 mounted to an example heater/cooler.

FIG. 14 shows a perspective view of the heat exchange system 200 mounted to a heater/cooler 400. As shown in FIG. 14, the heat exchange system 200 is mounted to the heater/cooler 400 such that the outer side 210 abuts a portion of the heater/cooler. Thus, in the case of heating, when the heater/cooler 400 is activated, the heat generated by the heat source is transferred to the housing 202 of the heat exchange system 200. The heat is then transferred to the formable material in the manner described above. In the case of cooling, when the heater/cooler 400 is activated, the heat of the heat exchange system 200 is transferred to the heater/cooler 400. The example hater/cooler shown in FIG. 14 is a Peltier device. However, any heater/cooler capable of heating/cooling the housing 202 to the necessary temperature is suitable, such as a resistive heater, a counter flow heater, a fan, etc.

As described above, the heat exchange system provides the benefit of being capable of heating or cooling formable material to much lower or higher temperatures than known systems, such that optical jetting performance can be achieved. Further, the heat exchange system and is easier to clean than known systems.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A heat exchange system, comprising:
   a housing including:
   an outer side;
   an inner side opposite the outer side;
   a supply channel on the inner side and defined by a first wall extending from the inner side, the supply channel extending in a longitudinal direction of the housing;
   an exit channel on the inner side and defined by a second wall extending from the inner side; and
   a plurality of fins extending from the inner side, the plurality of fins defining a plurality of transverse channels, each transverse channel of the plurality of transverse channels providing fluid communication between the supply channel and the exit channel;
   a cover covering the inner side of the housing; and a sealing mechanism including a plate and a plurality of fasteners configured to compress the cover and the housing such that a seal is formed between the cover and the housing,
wherein a plate has the same shape as the cover,
wherein the plurality of fasteners pass through the housing, the plate, and the cover, and
wherein the cover comprises a supply path having a first portion extending in the longitudinal direction and a second portion extending at an angle relative to the longitudinal direction and toward the supply channel.

2. The heat exchange system of claim 1,
wherein the housing includes a first end and a second end opposite the first end,
wherein the plurality of fins includes a first fin adjacent a second fin, and a third fin adjacent the second fin,
wherein the first fin and the second fin are closer to the first end than the third fin, and
wherein a distance between the first fin and the second fin is smaller than a distance between the second fin and the third fin.

3. The heat exchange system of claim 2,
wherein the distance between the first fin and the second fin defines a first transverse channel of the plurality of transverse channels, and
wherein the distance between the second fin and the third fin defines a second transverse channel of the plurality of transverse channels.

4. The heat exchange system of claim 3, wherein the second transverse channel is wider than the first transverse channel.

5. The heat exchange system of claim 1,
wherein the plurality of fins includes a first section of fins and a second section of fins,
wherein a distance between adjacent fins of the first section of fins is different from a distance between adjacent fins of the second section of fins.

6. The heat exchange system of claim 5,
wherein the distance between adjacent fins of the first section of fins is smaller than the distance between adjacent fins of the second section of fins.

7. The heat exchange system of claim 6,
wherein the housing includes a first end and a second end opposite the first end, and
wherein the first section of fins is closer to the first end of the housing than the second section of fins.

8. The heat exchange system of claim 5,
where the plurality of fins includes a third section of fins,
wherein a distance between adjacent fins of the third section of fins is different from the distance between adjacent fins of the first section of fins, and
wherein a distance between adjacent fins of the third section of fins is different from the distance between adjacent fins of the second section of fins.

9. The heat exchange system of claim 8, wherein the second section of fins is between the first section of fins and the third section of fins.

10. The heat exchange system of claim 9,
wherein the distance between adjacent fins of the first section of fins is smaller than the distance between adjacent fins of the second section of fins, and
wherein the distance between adjacent fins of the second section of fins is smaller than the distance between adjacent fins of the third section of fins.

11. The heat exchange system of claim 1,
wherein the supply path opens into the supply channel at a first end of the housing.

12. The heat exchange system of claim 11,
wherein the exit channel extends in the longitudinal direction of the housing,
wherein the cover comprises an exit path having a first portion extending in the longitudinal direction and a second portion extending at an angle relative to the longitudinal direction and toward the exit channel, and
wherein the exit channel opens into the exit path at the first end of the housing.

13. The heat exchange system of claim 1,
wherein the plurality of fasteners compresses the plate against the cover and compresses the cover against the housing.

14. The heat exchange system of claim 13, wherein the sealing mechanism comprises a gasket between the cover and the housing.

15. The heat exchange system of claim 13, wherein the plurality of fasteners are disposed along the perimeter of the plate and pass through the cover and the housing.

16. The heat exchange system of claim 1, wherein the supply channel, the exit channel, and the plurality of fins are coated with a parylene.

17. The heat exchange system of claim 1, wherein the cover is made of a material selected from the group consisting of polytetrafluoroethylene (PTFE), polychlorotrifluoroethylene (PCTFE), polyvinylidene fluoride (PVDF), high-density polyethylene (HDPE), polyether ether ketone (PEEK), or combinations thereof.

18. The heat exchange system of claim 1, wherein the plurality of fins extend seamlessly from the inner side of the housing.

19. The heat exchange system of claim 1,
wherein each fin of the plurality of fins has an end at the inner side,
wherein the first wall has an end at the inner side and the second wall has an end at the inner side, and
wherein the end of each fin is coplanar with the end of the first wall, and
wherein the end of each fin is coplanar with the end of the second wall.

20. The heat exchange system of claim 19,
wherein each fin has an opposite end opposite to the end of each fin at the inner side,
wherein the first wall has an opposite end opposite to the end of the first wall at the inner side,
wherein the second wall has an opposite end opposite to the end of the second wall at the inner side, and
wherein the opposite end of each fin is coplanar with the opposite end of the first wall and coplanar with the opposite end of the second wall.

21. The heat exchange system of claim 1,
wherein each fin of the plurality of fins has a length extending from the supply channel to the exit channel along the inner side, a height extending away from the inner side and perpendicular to the length, and a width extending along the inner side and perpendicular to the height and to the length,
wherein the first wall has an interior surface facing the width of each fin at the supply channel, and
wherein the second wall has an interior surface facing the width of each fin at the exit channel.

22. A method of cleaning a heat exchange system, the heat exchange system including:
a housing including:
an outer side;
an inner side opposite the outer side;

a supply channel on the inner side and defined by a first wall extending from the inner side, the supply channel extending in a longitudinal direction of the housing;

an exit channel on the inner side and defined by a second wall extending from the inner side; and a plurality of fins extending from the inner side, the plurality of fins defining a plurality of transverse channels, each transverse channel of the plurality of transverse channels providing fluid communication between the supply channel and the exit channel;

a cover covering the inner side of the housing; and a sealing mechanism including a plate and a plurality of fasteners configured to compress the cover and the housing such that a seal is formed between the cover and the housing, wherein a plate has the same shape as the cover, wherein the plurality of fasteners pass through the housing, the plate, and the cover, and wherein the cover comprises a supply path having a first portion extending in the longitudinal direction and a second portion extending at an angle relative to the longitudinal direction and toward the supply channel, the method comprising:
- releasing the seal formed between the cover and the housing;
- removing the cover to expose the inner side of the housing;
- cleaning the supply channel, the exit channel, the plurality of fins, and the plurality of transverse channels;
- covering the inner side of the housing with the cover; and
- applying the seal between the cover and the housing.

23. A method of making an article comprising:

changing a temperature of a formable material by flowing the formable through a heat exchange system, the heat exchange system including:
- a housing including:
  - an outer side;
  - an inner side opposite the outer side;
  - a supply channel on the inner side and defined by a first wall extending from the inner side;
  - an exit channel on the inner side and defined by a second wall extending from the inner side, the supply channel extending in a longitudinal direction of the housing; and
  - a plurality of fins extending from the inner side, the plurality of fins defining a plurality of transverse channels, each transverse channel of the plurality of transverse channels providing fluid communication between the supply channel and the exit channel;
- a cover covering the inner side of the housing; and
- a sealing mechanism including a plate and a plurality of fasteners configured to compress the cover and the housing such that a seal is formed between the cover and the housing, wherein a plate has the same shape as the cover, wherein the plurality of fasteners pass through the housing, the plate, and the cover, and wherein the cover comprises a supply path having a first portion extending in the longitudinal direction and a second portion extending at an angle relative to the longitudinal direction and toward the supply channel;

dispensing the formable material onto a substrate using a dispenser;

forming a pattern or a layer of the dispensed formable material on the substrate; and processing the formed pattern or layer to make the article.

* * * * *